US009786367B2

(12) United States Patent
Cagli

(10) Patent No.: US 9,786,367 B2
(45) Date of Patent: Oct. 10, 2017

(54) METHOD OF READING AN ELECTRONIC MEMORY DEVICE INCLUDING A PLURALITY OF MEMORY CELLS OF RESISTIVE RANDOM ACCESS MEMORY TYPE

(71) Applicant: COMMISSARIAT A L'ENERGIE ATOMIQUE ET AUX ENERGIES ALTERNATIVES, Paris (FR)

(72) Inventor: Carlo Cagli, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/184,343

(22) Filed: Jun. 16, 2016

(65) Prior Publication Data

US 2016/0372190 A1    Dec. 22, 2016

(30) Foreign Application Priority Data

Jun. 16, 2015 (FR) ...................................... 15 55469

(51) Int. Cl.
*G11C 11/00* (2006.01)
*G11C 13/00* (2006.01)

(52) U.S. Cl.
CPC ........ *G11C 13/004* (2013.01); *G11C 13/0011* (2013.01); *G11C 13/0007* (2013.01); *G11C 2013/0054* (2013.01)

(58) Field of Classification Search
CPC ............. G11C 13/004; G11C 13/0007; G11C 2013/0054; G11C 13/0002; G11C 13/0011

(Continued)

(56) References Cited

U.S. PATENT DOCUMENTS 9,373,393 B2 * 6/2016 Kim .................. G11C 13/0033
2008/0165595 A1    7/2008 Lam
(Continued)

FOREIGN PATENT DOCUMENTS

WO    WO 2014/137943 A2    9/2014

OTHER PUBLICATIONS

Search Report as issued in French Patent Application No. 1555469, dated Apr. 25, 2016.

*Primary Examiner* — David Lam
(74) *Attorney, Agent, or Firm* — Pillsbury Winthrop Shaw Pittman LLP

(57) ABSTRACT

A method for reading an electronic memory device including N memory cells Ci with $1 \geq i \geq N$ and $N \geq 2$, each cell Ci having a resistance Ri, the method including for each cell Ci, determining a set Ei of resistance values capable of being associated with the resistance Ri of the cell Ci; for each combination of N variables Vi, each variable Vi taking successively each resistance value among the predetermined set Ei, applying a mathematical function to the combination to obtain a resulting resistance value; for each combination of N variables Vi, associating a logic state of the electronic memory device with the resulting resistance value obtained previously, according to a comparison of the resulting resistance value with a same threshold resistance value; associating a resistance value with each resistance Ri to obtain a particular combination of N variables Vi; determining the logic state of the electronic memory device.

6 Claims, 6 Drawing Sheets

(58) Field of Classification Search
USPC .............. 365/148, 158, 189.07, 189.09
See application file for complete search history.

(56) References Cited

U.S. PATENT DOCUMENTS

2012/0257448 A1   10/2012   Ong
2014/0293674 A1   10/2014   Johnson

* cited by examiner

T1

|  |  | C1 | | |
|---|---|---|---|---|
|  |  | v1 | v2 | v3 |
| C2 | v1 | F(v1, v1) | F(v2, v1) | F(v3, v1) |
|  | v2 | F(v1, v2) | F(v2, v2) | F(v3, v2) |
|  | v3 | F(v1, v3) | F(v2, v3) | F(v3, v3) |

|  |  | C1 | | |
|---|---|---|---|---|
|  |  | v1 (1kΩ) | v2 (10kΩ) | v3 (100kΩ) |
| C2 | v1 (1kΩ) | 1kΩ | 3kΩ | 10kΩ |
|  | v2 (10kΩ) | 3kΩ | 10kΩ | 31kΩ |
|  | v3 (100kΩ) | 10kΩ | 31kΩ | 100kΩ |

|  |  | C1 | | |
|---|---|---|---|---|
|  |  | v1 (00) | v2 (01) | v3 (10) |
| C2 | v1 (00) | 1 (ON) | 1 (ON) | 0 (OFF) |
|  | v2 (01) | 1 (ON) | 0 (OFF) | 0 (OFF) |
|  | v3 (10) | 0 (OFF) | 0 (OFF) | 0 (OFF) |

|  | | C1 | | |
|---|---|---|---|---|
|  | | v1 (1kΩ) | v2 (10kΩ) | v3 (100kΩ) |
| C2 | v1 (1kΩ) | 0kΩ | 9kΩ | 99kΩ |
|  | v2 (10kΩ) | - 9kΩ | 0kΩ | 90kΩ |
|  | v3 (100kΩ) | - 99kΩ | -90kΩ | 0kΩ |

|  | | C1 | | |
|---|---|---|---|---|
|  | | v1 (00) | v2 (01) | v3 (10) |
| C2 | v1 (00) | 0 (OFF) | 0 (OFF) | 0 (OFF) |
|  | v2 (01) | 1 (ON) | 0 (OFF) | 0 (OFF) |
|  | v3 (10) | 1 (ON) | 1 (ON) | 0 (OFF) |

Fig. 6c'

METHOD OF READING AN ELECTRONIC MEMORY DEVICE INCLUDING A PLURALITY OF MEMORY CELLS OF RESISTIVE RANDOM ACCESS MEMORY TYPE

CROSS-REFERENCE TO RELATED APPLICATIONS

This application claims priority to French Patent Application No. 1555469, filed Jun. 16, 2015, the entire content of which is incorporated herein by reference in its entirety.

TECHNICAL FIELD OF THE INVENTION

The technical field of the invention is that of microelectronics, and in particular that of electronic memory devices. The present invention relates to a method for reading an electronic memory device, and in particular an electronic memory device of resistive random access memory type.

TECHNOLOGICAL BACKGROUND OF THE INVENTION

A resistive random access memory has two separate resistance states:
a high resistance state (HRS), also called "OFF" state, and
a low resistance state (LRS), also called "ON" state.

A resistive random access memory comprises first and second electrodes separated by an active zone. A resistive random access memory switches in a reversible manner from the OFF state to the ON state through application of a first threshold voltage between the first and second electrodes, and switches in a reversible manner from the ON state to the OFF state by application of a second threshold voltage between the first and second electrodes. It may thus be used to store binary information.

Resistive random access memories have notably the following advantages:
low threshold voltages required to switch from one state to the other;
long endurance;
low manufacturing costs.

A major drawback of resistive random access memories is nevertheless the large dispersion of resistances obtained around a mean resistance, from one memory device to another, for a same resistance state. The resistance value of a same resistance state may thus vary by more than an order of magnitude, from one memory device to another. This drawback is particularly critical for the OFF state of resistive random access memories.

The document WO 2014/137943 A2 describes a method for detecting resistance states of resistive memories by means of a detection amplifier. The detection amplifier makes it possible to compare the impedance values of several memories, between each other or compared to a fixed reference. The method described by the document WO 2014/137943 A2 thus makes it possible to evaluate the dispersion of impedance values of a resistance state, but does not make it possible to reduce this dispersion.

SUMMARY OF THE INVENTION

Each memory device of a set of memory devices has, for a given resistance state, a certain resistance value. An objective of the invention is to reduce the dispersion of the resistance values obtained for a same resistance state, within a set of electronic memory devices.

An aspect of the invention thus relates to a method for reading an electronic memory device comprising a plurality of memory cells of resistive random access memory type $C_i$ with i varying from 1 to N and $N \geq 2$, each memory cell $C_i$ having a resistance $R_i$, the method comprising the following steps:
a step of associating a resistance value with each resistance $R_i$ to obtain a particular combination of N resistance values;
a step of applying a mathematical function to the particular combination of N resistance values to obtain a resulting resistance value;
a step of determining the logic state of the electronic memory device.

Thanks to the invention, the electronic memory device comprises a plurality of memory cells of resistive random access memory type, and the plurality of memory cells of resistive random access memory type is advantageously used to determine the logic state of the electronic memory device. The application of a mathematical function to a particular combination of N resistance values makes it possible to obtain a resulting resistance value having a reduced dispersion compared to the prior art.

Apart from the characteristics which have been evoked in the preceding paragraph, the method for reading an electronic memory device according to an aspect of the invention may have one or more additional characteristics among the following, considered individually or according to any technically possible combinations thereof:
The mathematical function applied is the geometric mean function. Alternatively, the mathematical function applied is the arithmetic mean function.
Each memory cell $C_i$ of the plurality N of memory cells is an oxide based resistive random access memory. Alternatively, each memory cell $C_i$ of the plurality N of memory cells is a conductive bridge resistive random access memory.
According to a first embodiment, the method for reading comprises, in order:
the step of associating a resistance value with each resistance $R_i$ to obtain a particular combination of N resistance values;
the step of applying a mathematical function to the particular combination of N resistance values to obtain a resulting resistance value;
the step of determining the logic state of the electronic memory device, the determination being obtained according to a comparison of the resulting resistance value with a threshold resistance value.
According to the first embodiment, each resistance value is associated with a binary code, and the resulting resistance value is associated with a resulting binary code.
According to a second embodiment, the step of associating a resistance value with each resistance $R_i$ takes place after the step of applying a mathematical function to the particular combination of N resistance values.
The reading method according to the second embodiment comprises, in order:
for each resistance $R_i$, a step of determining a set $E_i$ of resistance values capable of being associated with said resistance $R_i$;
for each combination of N variables $V_i$, each variable $V_i$ taking successively each resistance value among the predetermined set $E_i$, the step of applying the mathematical function to said combination to obtain a resulting resistance value;

a step of associating a logic state of the electronic memory device with each resulting resistance value obtained previously, according to a comparison of each resulting resistance value with a threshold resistance value;

the step of associating a resistance value with each resistance Ri to obtain a particular combination of N resistance values;

the step of determining the logic state of the electronic memory device, the logic state being associated with the resulting resistance value corresponding to the particular combination.

According to the second embodiment, each resistance value is associated with a binary code, and each resulting resistance value is associated with a resulting binary code.

According to any of the embodiments, the step of associating a resistance value with each resistance Ri is carried out using at least one comparator.

The invention and its different applications will be better understood on reading the description that follows and by examining the figures that accompany it.

BRIEF DESCRIPTION OF THE FIGURES

The figures are presented for indicative purposes and in no way limit the invention.

FIG. 6a shows a first table, for carrying out a step of applying a mathematical function, according to the second embodiment of the invention.

FIG. 6b shows a second table grouping together the resulting resistance values obtained by the application of a first mathematical function, according to the second embodiment of the invention.

FIG. 6b' shows a second table grouping together the resulting resistance values obtained by the application of a second mathematical function, according to the second embodiment of the invention.

FIG. 6c shows a third table grouping together the logic states associated with the resulting resistance values of FIG. 6b, according to the second embodiment of the invention.

FIG. 6c' shows a third table grouping together the logic states associated with the resulting resistance values of FIG. 6b', according to the second embodiment of the invention.

a first distribution of the resistance values obtained for a same resistance state of an electronic memory device, in accordance with a reading method of the prior art;

a second distribution of the resistance values obtained for a same resistance state of an electronic memory device, in accordance with a reading method according to an embodiment of the invention;

a third distribution of the resistance values obtained for a same resistance state of an electronic memory device, in accordance with a reading method according to an embodiment of the invention.

DETAILED DESCRIPTION OF AT LEAST ONE EMBODIMENT OF THE INVENTION

Unless stated otherwise, a same element appearing in the different figures has a single reference.

Figure 1:
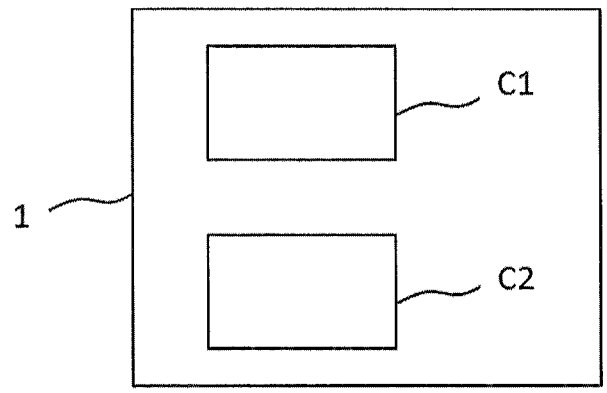
FIG. 1 shows schematically an electronic memory device comprising a plurality of memory cells of resistive random access memory type.

FIG. 1 shows schematically an electronic memory device 1 comprising a plurality of memory cells of resistive random access memory type $Ci$, with i varying from 1 to N, N being a natural number greater than or equal to 2. Each memory cell $Ci$ has a resistance $Ri$.

The particular example of FIG. 1 corresponds to the case where N=2 and the electronic memory device 1 thus comprises:

a first memory cell C1 of resistive random access memory type, the first memory cell C1 having a first resistance R1, and a second memory cell C2 of resistive random access memory type, the second memory cell C2 having a second resistance R2.

The field of the present invention more particularly relates to two categories of resistive memories:

oxide based resistive random access memories OxRRAM, comprising an active zone based on an oxide based active material, and conductive bridge resistive random access memories CBRAM, comprising an active zone based on an ionic conduction material, the active zone forming a solid ionic conduction electrolyte arranged between an electrode forming an inert cathode and an electrode forming a soluble anode.

Thus, each memory cell $Ci$ of the plurality N of memory cells of the electronic memory device 1 is advantageously an oxide based resistive random access memory OxRRAM, or alternatively a conductive bridge resistive random access memory CBRAM.

Figure 2:
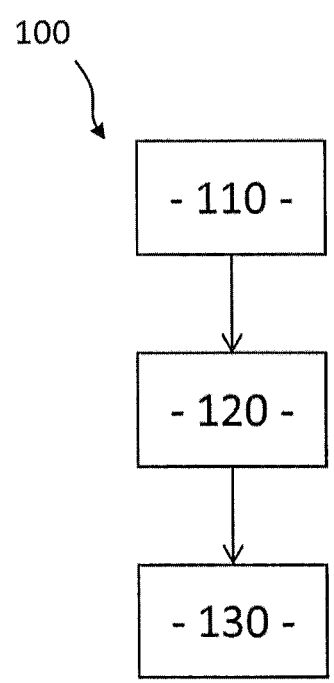
FIG. 2 shows a diagram of the steps of a method for reading an electronic memory device according to a first embodiment of the invention.

FIG. 2 shows a diagram of the steps of a method 100 for reading an electronic memory device according to a first embodiment of the invention. FIG. 2 thus shows:

a step 110 according to which a resistance value is associated with each resistance $Ri$ of each memory cell $Ci$ of the electronic memory device 1, to obtain a particular combination of N resistance values. Each resistance value may advantageously be represented by a binary code.

At the end of step 110 described previously, a step 120 according to which a mathematical function is applied to the particular combination of N resistance values, to obtain a resulting resistance value. The resulting resistance value may advantageously be represented by a resulting binary code.

At the end of step 120 described previously, a step 130 according to which the logic state of the electronic memory device 1 is determined.

Figure 3:
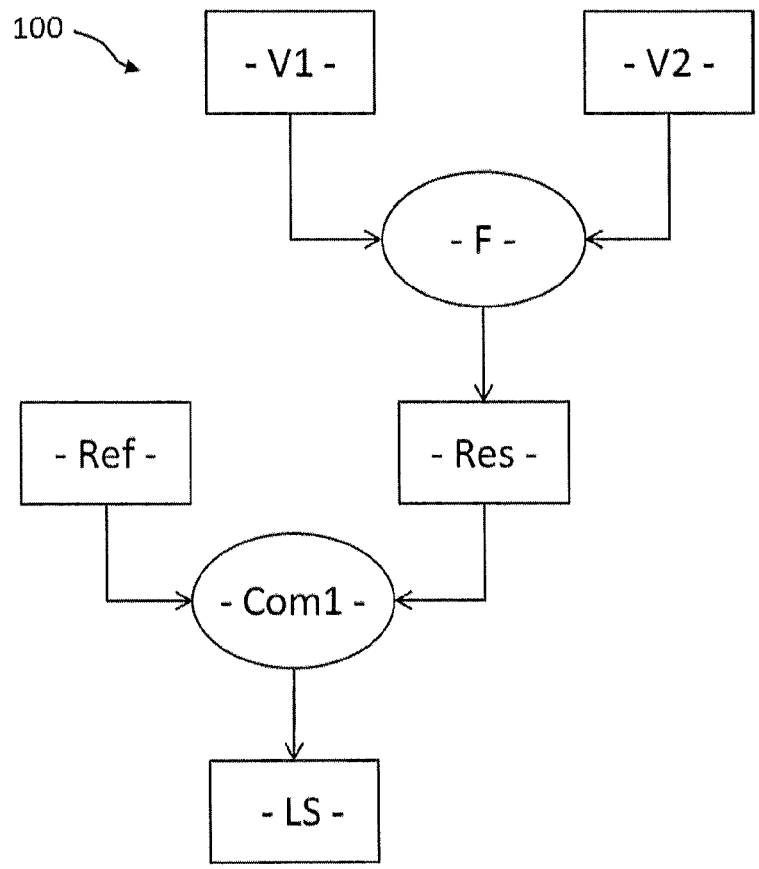
FIG. 3 shows schematically an example of carrying out the method for reading an electronic memory device according to the first embodiment of the invention.

FIG. 3 shows schematically an example of carrying out the method 100 for reading an electronic memory device according to the first embodiment of the invention.

The first memory cell C1 of the electronic memory device 1 is read in order to associate a first resistance value V1 with the first resistance R1 of the first memory cell C1. Similarly, the second memory cell C2 of the electronic memory device 1 is read in order to associate a second resistance value V2 with the second resistance R2 of the second memory cell C2.

Figure 4:
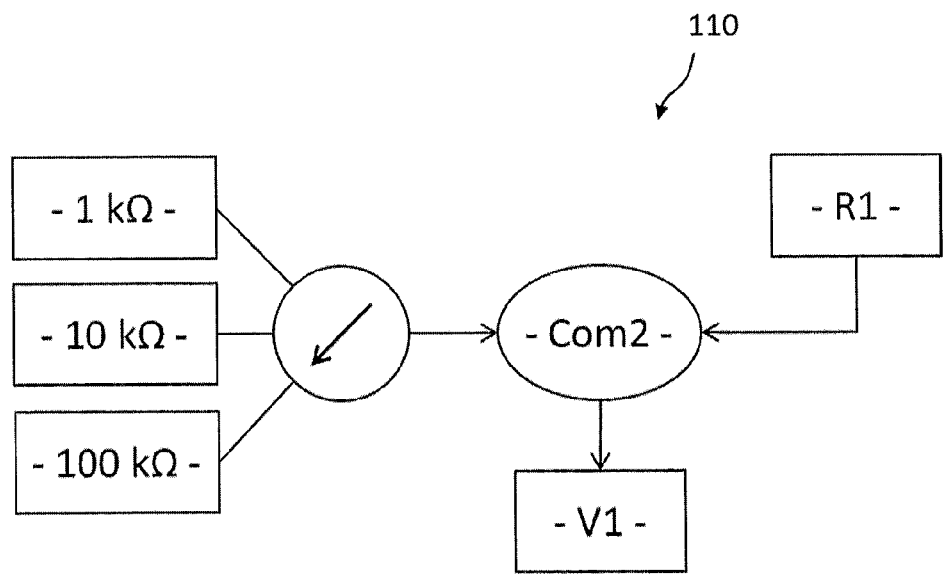
FIG. 4 shows schematically an example of carrying out a step of associating a resistance value with a resistance of a memory cell of resistive random access memory type, according to an embodiment of the invention.

A method and a device for reading a memory cell of an electronic memory device are described hereafter, in relation with FIG. 4.

A mathematical function, referenced "F" in FIG. 3, is then applied to the first resistance value V1 and to the second resistance value V2. The result of the application of the mathematical function F to the first and second resistance values V1 and V2 is a resulting resistance value, referenced "Res" in FIG. 3:

$$F(V1,V2)=Res$$

The resulting resistance value Res is then compared, for example by means of a comparator referenced "Com1" in FIG. 3, with a threshold resistance value, referenced "Ref" in FIG. 3. The threshold resistance value Ref is typically predefined. The logic state of the electronic memory device 1 is then determined according to the result of the comparison of the resulting resistance value Res with the threshold resistance value Ref. The logic state of the electronic memory device 1 is referenced "LS" in FIG. 3. For example:
  if Res>Ref, the electronic memory device 1 is in the OFF state,
  if Res≤Ref, the electronic memory device 1 is in the ON state.

The mathematical function F is advantageously a geometric mean function. The mathematical function F applied to a particular combination of N resistance values is expressed thus:

$$F(V_1, V_2, \ldots, V_N) = (V_1 \times V_2 \times \ldots \times V_N)^{1/N}$$

The mathematical function F may alternatively be an arithmetic mean function. The mathematical function F applied to a particular combination of N resistance values is then expressed:

$$F(V_1, V_2, \ldots, V_N) = \frac{(V_1 + V_2 + \ldots + V_N)}{N}$$

By using a mathematical function such as a geometric or arithmetic mean, the resulting distribution of the resistance values obtained is reduced for a same resistance state. In order to be able to distinguish correctly the two resistance states ON and OFF, it remains necessary that the distribution obtained for the resistance state ON is distinct and separate from the distribution obtained for the resistance state OFF.

In the particular case where the electronic memory device 1 only comprises the first memory cell C1 and the second memory cell C2, and where the first and second memory cells C1 and C2 are programmed in a complementary manner, the mathematical function F may advantageously be a subtraction function. "Complementary programming" is taken to mean the fact that if the first memory cell C1 is in the OFF state then the second memory cell C2 is in the ON state, and conversely that if the first memory cell C1 is in the ON state then the second memory cell C2 is in the OFF state. The mathematical function F applied to a particular combination of two resistance values is then expressed:

$$F(V_1,V_2)=V_1-V_2$$

When the first and second memory cells C1 and C2 are programmed in a complementary manner and when the mathematical function F is a subtraction function, it is no longer necessary that the distribution obtained for the resistance state ON is distinct and separate from the distribution obtained for the resistance state OFF: it suffices in fact that the first and second memory cells C1 and C2 have distinct resistance values.

FIG. 4 shows schematically an example of carrying out of the step 110 of associating a resistance value with a resistance of a memory cell of resistive random access memory type, according to an embodiment of the invention. A comparator Com2 compares the first resistance R1 of the first memory cell C1 with several predefined resistances, of known value. In the particular example represented in FIG. 4, the comparator Com2 compares the first resistance R1 with three predefined resistances:
  a first predefined resistance of value 1 kΩ,
  a second predefined resistance of value 10 kΩ, and
  a third predefined resistance of value 100 kΩ.

The comparator Com2 may naturally comprise only two predefined resistances, or more than three predefined resistances. The values of the predefined resistances may naturally be chosen differently with respect to the particular example cited.

The comparator Com2 associates with the first resistance R1 a first value V1, which is the predefined resistance value the closest to the real value of the first resistance R1. In the particular example represented in FIG. 4, if the first resistance R1 has a real resistance of 6 kΩ or 12 kΩ, the comparator Com2 associates with it the first value V1=10 kΩ, that is to say the value of the second predefined resistance. If the first resistance R1 has a real resistance of 55 kΩ, 78 kΩ or 110 kΩ, the comparator Com2 associates with it the first value V1=100 kΩ, that is to say the value of the third predefined resistance.

The comparator Com2 may also be used to associate with the second resistance R2 of the second memory cell C2 a second value V2. Alternatively, another comparator than the comparator Com2 may be used to associate with the second resistance R2 of the second memory cell C2 a second value V2. This other comparator may comprise the same number of predefined resistances as the comparator Com2, or a different number of predefined resistances compared to the comparator Com2. If this other comparator comprises the same number of predefined resistances as the comparator Com2, the values of the predefined resistances of the other comparator may be identical to the values of the predefined resistances of the comparator Com2, or different to the predefined resistance values of the comparator Com2.

Figure 5:
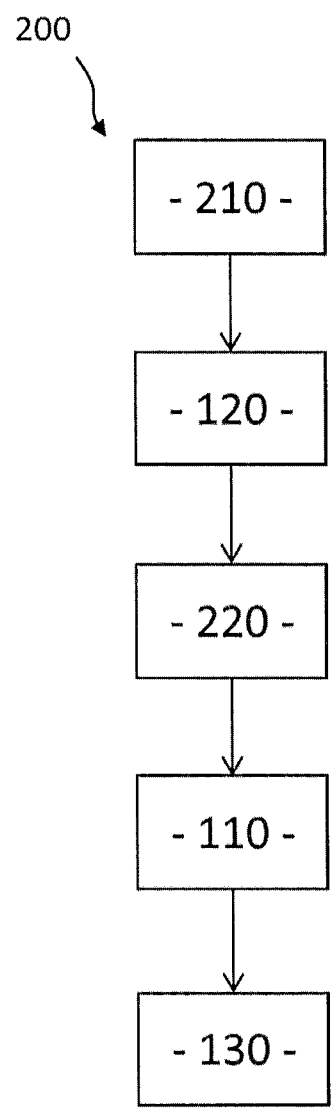
FIG. 5 shows a diagram of the steps of a method for reading an electronic memory device according to a second embodiment of the invention.

FIG. 5 shows a diagram of the steps of a method 200 for reading an electronic memory device according to a second embodiment of the invention. FIG. 5 shows a step 210 according to which, for each resistance Ri of each memory cell Ci, a set Ei of resistance values capable of being associated with said resistance Ri is determined. In the particular example of the electronic memory device 1:
  a first set E1 of distinct resistance values capable of being associated with the first resistance R1 of the first memory cell C1 is determined, and
  a second set E2 of distinct resistance values capable of being associated with the second resistance R2 of the second memory cell C2 is determined.

The first set E1 comprises for example three resistance values capable of being associated with the first resistance R1: a first value v1, a second value v2 distinct from the first value v1 and a third value v3 distinct from the first and second values v1 and v2. The second set E2 is for example identical to the first set E1. Alternatively, the second set E2 may comprise a different number of resistance values and/or different resistance values compared to the first set E1.

At the end of step 210, the step 120 of applying a mathematical function to a particular combination of N resistance values, described previously, is carried out for each combination of N variables Vi, each variable Vi taking successively each resistance value among the predetermined set Ei.

In the particular example of the electronic memory device 1:
- the first set E1 comprising the first, second and third resistance values v1, v2 and v3 has been determined for the first resistance R1 of the first memory cell C1, and
- the second set E2, identical to the first set E1, has been determined for the second resistance R2 of the second memory cell C2.

The mathematical function F is thus applied to the nine combinations of two variables (V1, V2), where the first value V1 of the first resistance R1 takes successively the values v1, v2 and v3 of the first set E1, and where the second value V2 of the second resistance R2 takes successively the values v1, v2 and v3 of the second set E2.

A first table T1, represented in FIG. 6a, shows the application of the mathematical function F to said nine combinations.

A second table T2, represented in FIG. 6b, shows the result of the application of the mathematical function F to said nine combinations, in the particular case where:
- the first resistance value v1 is equal to 1 kΩ, the second resistance value v2 is equal to 10 kΩ and the third resistance value v3 is equal to 100 kΩ;
- the mathematical function F is the geometric mean function.

The second table T2 thus groups together the nine resulting resistance values obtained by the application of the mathematical geometric mean function F to said nine combinations. The nine resulting resistance values in the second table T2 are rounded off by truncation to kΩ.

A table T2' according to another example, represented in FIG. 6b', shows the result of the application of the mathematical function F to said nine combinations, in the particular case where:
- the first resistance value v1 is equal to 1 kΩ, the second resistance value v2 is equal to 10 kΩ and the third resistance value v3 is equal to kΩ;
- the mathematical function F is the subtraction function.

The alternative table T2' according to this other example thus groups together the resulting nine resistance values obtained by the application of the mathematical subtraction function F to said nine combinations.

At the end of step 120, a step 220 is carried out according to which a logic state of the electronic memory device is associated with each resulting resistance value obtained previously, according to a comparison of each resulting resistance value with a threshold resistance value.

A third table T3, represented in FIG. 6c, shows an example of result of the association of a logic state of the electronic memory device 1 with each of the nine resulting resistance values of the second table T2, in the particular case where:
- the threshold resistance value is equal to 10 kΩ,
- the electronic memory device 1 is in the OFF state, or "0", when its resulting resistance value is greater than or equal to the threshold resistance value, that is to say 10 kΩ,
- the electronic memory device 1 is in the ON state, or "1", when its resulting resistance value is less than the threshold resistance value, that is to say 10 kΩ.

A table T3' according to another example, represented in FIG. 6c', shows the result of the association of a logic state of the electronic memory device 1 with each of the resulting nine resistance values of table T2', in the particular case where:
- the threshold resistance value is equal to 0 kΩ,
- the electronic memory device 1 is in the OFF state, or "0", when its resulting resistance value is greater than or equal to the threshold resistance value, that is to say 0 kΩ,
- the electronic memory device 1 is in the ON state, or "1", when its resulting resistance value is less than the threshold resistance value, that is to say 0 kΩ.

In the particular examples of tables T3 and T3', a binary code is associated with each resistance value of the first set E1 and of the second set E2:
- the binary code "00" is associated with the first resistance value v1,
- the binary code "01" is associated with the second resistance value v2, and
- the binary code "10" is associated with the third resistance value v3.

At the end of step 220, the step 110 of associating a resistance value with each resistance Ri, described previously, is carried out. The example of carrying out step 110, described previously in relation with FIG. 4, may be used.

The result of step 110 may for example be the following, in the case of the electronic memory device 1:
- the first resistance R1 has a first value V1=10 kΩ,
- the second resistance R2 has a second value V2=100 kΩ.

At the end of step 110, the step 130 of determining the logic state of the electronic memory device is carried out. According to the second embodiment, the logic state is predetermined by the value of the resulting resistance. The value of the resulting resistance has been calculated previously during step 120, and a logic state has been associated previously with this resulting resistance value during step 220.

In the particular example where the mathematical function is the geometric mean function, for the first value V1=10 kΩ and the second value V2=100 kΩ, the value of the resulting resistance is equal to 31 kΩ. The state associated with this resulting resistance value is the OFF state.

In the other particular example where the mathematical function is the subtraction function, for the first value V1=10 kΩ and the second value V2=100 kΩ, the resulting resistance value is equal to −90 kΩ. The state associated with this resulting resistance value is the ON state.

Figure 7:
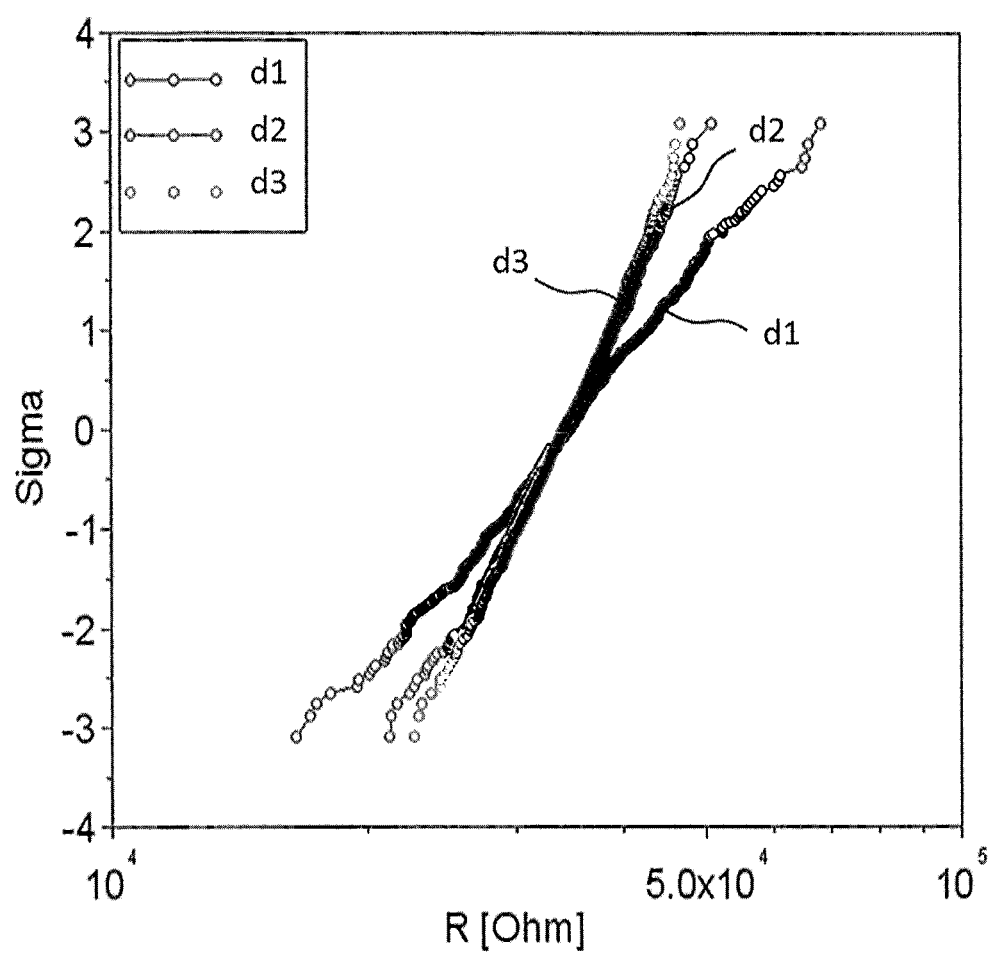
FIG. 7 shows schematically.

FIG. 7 shows:
- a first distribution d1 of the resistance values obtained for a same resistance state of an electronic memory device, in accordance with a reading method of the prior art;
- a second distribution d2 of the resistance values obtained for a same resistance state of an electronic memory device, in accordance with a reading method 100 or 200 according to an embodiment of the invention;
- a third distribution d3 of the resistance values obtained for a same resistance state of an electronic memory device, in accordance with a reading method 100 or 200 according to an embodiment of the invention.

The first, second and third distributions d1, d2 and d3 have been measured for around 10,000 resistance states. The second distribution d2 is obtained for an electronic memory device comprising two electronic memory cells. The third distribution d3 is obtained for an electronic memory device comprising three electronic memory cells. FIG. 7 shows that the second and third distributions d2 and d3 have a dispersion narrower than the first distribution d1.

The invention claimed is:

1. A method for reading an electronic memory device comprising a plurality N of memory cells of resistive random access memory type Ci with i varying from 1 to N and N≥2, each memory cell Ci having a resistance Ri, the method Comprising in order the following steps:

for each memory cell Ci, determining a set Ei of resistance values capable of being associated with the resistance Ri of the memory cell Ci;

for each combination of N variables Vi, each variable Vi taking successively each resistance value among the predetermined set Ei, applying a mathematical function to said combination of N variables Vi to obtain a resulting resistance value;

for each combination of N variables Vi, associating a logic state of the electronic memory device with the resulting resistance value obtained previously, according to a comparison of the resulting resistance value with a same threshold resistance value;

associating a resistance value with each resistance Ri to obtain a particular combination of N variables Vi, and determining the logic state of the electronic memory device, the logic state being associated with the resulting resistance value corresponding to the particular combination.

2. The reading method according to claim 1, wherein the mathematical function applied is the geometric mean function.

3. The reading method according to claim 1, wherein each memory cell Ci of the plurality N of memory cells is an oxide based resistive random access memory.

4. The reading method according to claim 1, wherein each memory cell Ci of the plurality N of memory cells is a conductive bridge resistive random access memory.

5. The reading method according to claim 1, wherein each resistance value is associated with a binary code, and wherein each resulting resistance value is associated with a resulting binary code.

6. The reading method according to claim 1, wherein associating a resistance value with each resistance Ri is carried out using at least one comparator.

* * * * *